US007713815B2

(12) United States Patent
Lehr et al.

(10) Patent No.: US 7,713,815 B2
(45) Date of Patent: May 11, 2010

(54) SEMICONDUCTOR DEVICE INCLUDING A VERTICAL DECOUPLING CAPACITOR

(75) Inventors: Matthias Lehr, Dresden (DE); Kai Frohberg, Niederau (DE); Christoph Schwan, Gebhardshain (DE)

(73) Assignee: GlobalFoundries Inc., Grand Cayman (KY)

( * ) Notice: Subject to any disclaimer, the term of this patent is extended or adjusted under 35 U.S.C. 154(b) by 539 days.

(21) Appl. No.: 11/379,605

(22) Filed: Apr. 21, 2006

(65) Prior Publication Data
US 2007/0001203 A1 Jan. 4, 2007

(30) Foreign Application Priority Data
Jun. 30, 2005 (DE) ............ 10 2005 030 585

(51) Int. Cl.
*H01L 21/8242* (2006.01)
(52) U.S. Cl. .............. 438/244; 438/243; 438/386; 438/387
(58) Field of Classification Search ......... 438/241–249, 438/258–270, 287, 386–392; 257/296, 298, 257/300, 301, E27.084, E27.085, E27.09
See application file for complete search history.

(56) References Cited

U.S. PATENT DOCUMENTS

| | | | |
|---|---|---|---|
| 5,770,875 A | 6/1998 | Assaderaghi et al. ........ 257/301 |
| 6,111,804 A | 8/2000 | Borkar ........................ 365/206 |
| 2002/0066916 A1 | 6/2002 | Hsu et al. .................... 257/301 |
| 2002/0172070 A1 | 11/2002 | Arimoto et al. ............. 365/149 |
| 2003/0017667 A1* | 1/2003 | Park et al. ................... 438/243 |
| 2004/0016944 A1 | 1/2004 | Ahn et al. .................... 357/222 |
| 2004/0038492 A1 | 2/2004 | Okazaki et al. ............. 438/391 |
| 2004/0092073 A1 | 5/2004 | Cabral, Jr. et al. .......... 438/287 |
| 2004/0195621 A1 | 10/2004 | Nasr | |
| 2004/0229424 A1* | 11/2004 | Fischer et al. ............... 438/232 |
| 2006/0017115 A1* | 1/2006 | Tu et al. ...................... 257/371 |

FOREIGN PATENT DOCUMENTS

DE 102 40 423 A1 3/2004
JP 2002222924 A 1/2001

OTHER PUBLICATIONS

F. Roozeboom, et al. "High-Value MOS Capacitor Arrays in Ultradeep Trenches in Silicon" Microelectronic Engineering 53, 2000.
International Search Report Dated Oct. 19, 2006.
Translation of Official Communication from German Patent Office for German Patent Application No. 10 2005 030 585.7-33 dated Feb. 27, 2009.

* cited by examiner

*Primary Examiner*—Dung A. Le
(74) *Attorney, Agent, or Firm*—Williams, Morgan & Amerson, P.C.

(57) ABSTRACT

A vertical or three-dimensional non-planar configuration for a decoupling capacitor is provided, which significantly reduces the required die area for capacitors of high charge carrier storage capacity. The non-planar configuration of the decoupling capacitors also provides enhanced pattern uniformity during the highly critical gate patterning process.

9 Claims, 7 Drawing Sheets

SEMICONDUCTOR DEVICE INCLUDING A VERTICAL DECOUPLING CAPACITOR

BACKGROUND OF THE INVENTION

1. Field of the Invention

The present invention generally relates to the field of fabricating integrated circuits, and, more particularly, to the formation of semiconductor devices including field effect transistors, such as MOS transistors, and decoupling capacitors for reducing switching noise.

2. Description of the Related Art

In modern integrated circuits, a huge number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with an improved degree of performance in terms of speed and/or power consumption. A reduction in size of transistor is an important aspect in steadily improving device performance of complex integrated circuits, such as CPUs. The reduction in size commonly brings about an increased switching speed, thereby enhancing signal processing performance and also dynamic power consumption of the individual transistors. That is, due to the reduced switching time period, the transient currents, upon switching a CMOS transistor element from logic low to logic high, are significantly reduced.

On the other hand, the reduction of feature sizes, such as the channel length of the transistor elements in the deep sub-micron regime, entails a plurality of issues that may partially offset the advantages obtained by the improved switching performance. For example, reducing the channel length of field effect transistors requires the reduction of the thickness of the gate insulation layer in order to maintain a sufficiently high capacitive coupling of the gate electrode to the channel region so as to appropriately control the formation of the conductive channel that builds up upon application of a control voltage to the gate electrode. For highly sophisticated devices, currently featuring a channel length of 0.1 μm or even less, a thickness of the gate insulation layer, typically comprising silicon dioxide for the superior and well known characteristics of the interface between the silicon dioxide and the underlying channel region, is on the order of 1.5-3 nm or even less. For a gate dielectric of this order of magnitude, it turns out that, in total, the leakage current passing through the thin gate dielectric may become comparable to the transient currents, since the leakage currents exponentially rise as the gate dielectric thickness is linearly reduced.

In addition to the large number of transistor elements, a plurality of passive capacitors are typically formed in integrated circuits that are used for a plurality of purposes, such as for decoupling. Decoupling in integrated circuits is an important aspect for reducing the switching noise of the fast switching transistors, since the decoupling capacitor may provide energy at a specific point of the circuitry, for instance at the location of a fast switching transistor, and thus reduce voltage variations which may otherwise unduly affect the logic state represented by the transistor. Since these capacitors are usually formed in and on active semiconductor regions, significant die area is consumed by the decoupling capacitors. Typically, these capacitors are formed in a planar configuration over active semiconductor regions, which act as a first capacitor electrode. The capacitor dielectric is formed during the process of manufacturing gate insulation layers of field effect transistors, wherein the gate material is usually patterned along with gate electrode structures so as to serve as the second capacitor electrode. Thus, in addition to the significant consumption of die area, increased leakage currents may be encountered in devices requiring highly capacitive decoupling elements, thereby significantly contributing to the total static leakage consumption and, therefore, to the total power consumption of the integrated circuit. For sophisticated applications, in terms of power consumption and/or heat management, the high amount of static power consumption may not be acceptable, and, therefore, usually a so-called dual gate oxide processing may be used to increase the thickness of the dielectric layer of the capacitors, thereby reducing the leakage current of these elements.

With reference to FIGS. 1a-1c, a typical prior art process flow for forming a semiconductor device comprising a highly capacitive decoupling capacitor having a moderate leakage current will now be described. FIG. 1a schematically shows a cross-sectional view of a semiconductor device 100 at a specific manufacturing stage. The semiconductor device 100 comprises a substrate 101, for example a silicon substrate, including a first semiconductor region 130 for receiving a transistor element and a second semiconductor region 120 for receiving a decoupling capacitor of high capacitance. Thus, the semiconductor region 120 may, contrary to the semiconductor region 130, occupy a significant fraction of a functional block of the device 100. The first and second semiconductor regions 130, 120 are enclosed by respective isolation structures 102. The first semiconductor region 130 and, partially, the corresponding isolation structure 102, are covered by a mask layer 103 that may be comprised of photoresist. The second semiconductor region 120 comprises a surface portion 104 having severe lattice damage caused by an ion implantation, as indicated by 105.

A typical process flow for forming the semiconductor device as depicted in FIG. 1a includes sophisticated photolithography and etch techniques for defining the isolation structures 102, followed by a further photolithography step to pattern the resist mask 103. As these process techniques are well known in the art, a detailed description thereof is omitted. Subsequently, the ion implantation 105 is carried out with any appropriate ions, such as silicon, argon, xenon and the like, wherein a dose and energy are selected to create severe lattice damage in the portion 104, thereby significantly changing the diffusion behavior of the portion 104 during an oxidation process that is to be carried out subsequently.

FIG. 1b schematically shows the semiconductor structure 100 in an advanced manufacturing stage. A first dielectric layer 131, substantially comprised of silicon dioxide and having a first thickness 132, is formed on the first semiconductor region 130. A second dielectric layer 121, having a second thickness 122 and comprised of the same material as the first dielectric layer 131, is formed on the second semiconductor region 120. The first and the second dielectric layers 131 and 121 are formed by conventional oxidation in a high temperature furnace process or by a rapid thermal oxidation process. Due to the severe lattice damage of the surface portion 104, the oxygen diffusion in this surface portion 104 is significantly enhanced compared to silicon portions having a substantially undisturbed crystallinity, such as in the surface region of the first semiconductor region 130. Consequently, oxide growth in and on the second semiconductor region 120 is increased compared to the growth rate of the first semiconductor region 130 so that the first thickness 132 differs from the second thickness 122 by approximately 0.2-1.0 nm for a thickness of the first dielectric layer 131 on the order of 1-5 nm.

FIG. 1c schematically shows the semiconductor device 100 in a further advanced manufacturing stage, wherein a decoupling capacitor 140 is formed in and on the second semiconductor region 120, and a field effect transistor 150 is formed in and on the first semiconductor region 130. The transistor element 150 comprises a gate electrode 133 including, for example, highly doped polysilicon and a metal silicide portion 135. Moreover, sidewall spacers 134 are formed adjacent to sidewalls of the gate electrode 133. Source and drain regions 136, each including a metal silicide portion 135, are formed in the first semiconductor region 130. The capacitor 140 comprises a conductive electrode 123 comprised of the same material as the gate electrode 133 and formed over the second dielectric layer 121. The electrode 123 represents a first electrode of the capacitor 140. The capacitor electrode 123 includes a metal silicide portion 125 and is enclosed by sidewall spacer elements 124.

A typical process flow for forming the transistor element 150 and the capacitor 140 may include the following steps. A polysilicon layer may be deposited over the device as shown in FIG. 1b and may be patterned by well-known photolithography and etching techniques to create the capacitor electrode 123 and the gate electrode 133 in a common process. Subsequently, the drain and source region 136 are formed by ion implantation, wherein intermittently the sidewall spacers 134 and the sidewall spacers 124 are formed so that the sidewall spacers 134 may act as implantation masks to appropriately shape the dopant concentration of the drain and source regions 136. Thereafter, the metal silicide portions 125 and 135 may be formed by depositing a refractory metal and initiating a chemical reaction between the metal and the underlying polysilicon of the capacitor electrode 123, the gate electrode 133 and the silicon in the drain and source regions 136.

As is evident from FIG. 1c, the capacitor 140 having the second dielectric layer 121 with the increased thickness 122 will exhibit a reduced leakage current rate compared to the corresponding leakage rate caused by the relatively thin first dielectric layer 131 having the second thickness 132 that is optimized to provide the required dynamic performance of the transistor 150. Although a remarkably improved leakage rate of the capacitor 140 may be obtained with the above-described conventional approach, one decisive drawback is the significantly reduced capacitance per unit area of the capacitor 140 owing to the increased thickness of the second dielectric layer 121. Thus, for a given desired charge storage capacity as required for an enhanced decoupling effect, an even more enlarged area is necessary for the capacitor 140. A further disadvantage of the conventional prior art approach is the requirement of a high temperature oxidation process for forming the first and second dielectric layers 131 and 121 so that this process scheme may not be compatible with alternative solutions for forming extremely thin gate dielectrics, such as advanced deposition methods for forming ultra-thin gate insulation layers. Moreover, the process flow described above leads to a highly non-uniform pattern density, i.e., regions with increased dimensions representing, for instance, the capacitor 140, are located in the vicinity of tiny regions such as the transistor 150, which may compromise the patterning process for forming the highly critical gate electrodes, such as the gate electrode 133.

In view of the above-described situation, there is a need for an improved technique that enables the formation of capacitors, while avoiding, or at least reducing the effects of, one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a semiconductor device and a corresponding manufacturing method, wherein chip area may be saved and may therefore be used for other circuitry, in that capacitors of high charge carrier storage capability, such as decoupling capacitors, are formed in a three-dimensional or vertical configuration. By providing a three-dimensional configuration, the "two-dimensional consumption" of precious chip area may be reduced for a given target capacitance, or the decoupling capacitance within a specified die region may be significantly increased without requiring additional die area. Moreover, the provision of a three-dimensional capacitor configuration in logic circuitry, such as CPUs, also offers enhanced flexibility in designing the capacitor, wherein device specific and process specific requirements, such as improved pattern density uniformity and the like, may be taken into consideration.

According to one illustrative embodiment of the present invention, a semiconductor device comprises at least one transistor element and a decoupling capacitor having a non-planar configuration, wherein the decoupling capacitor is connected to the at least one transistor element.

In accordance with another illustrative embodiment of the present invention, a method comprises forming a plurality of transistor elements in and on a semiconductor layer, wherein the plurality of transistor elements defines an arithmetic unit. Moreover, the method comprises forming a recess in the semiconductor layer and forming a capacitor in the recess.

BRIEF DESCRIPTION OF THE DRAWINGS

The invention may be understood by reference to the following description taken in conjunction with the accompanying drawings, in which like reference numerals identify like elements, and in which:

FIG. 2b schematically shows a top view of the device of FIG. 2a;

Figure 1A:
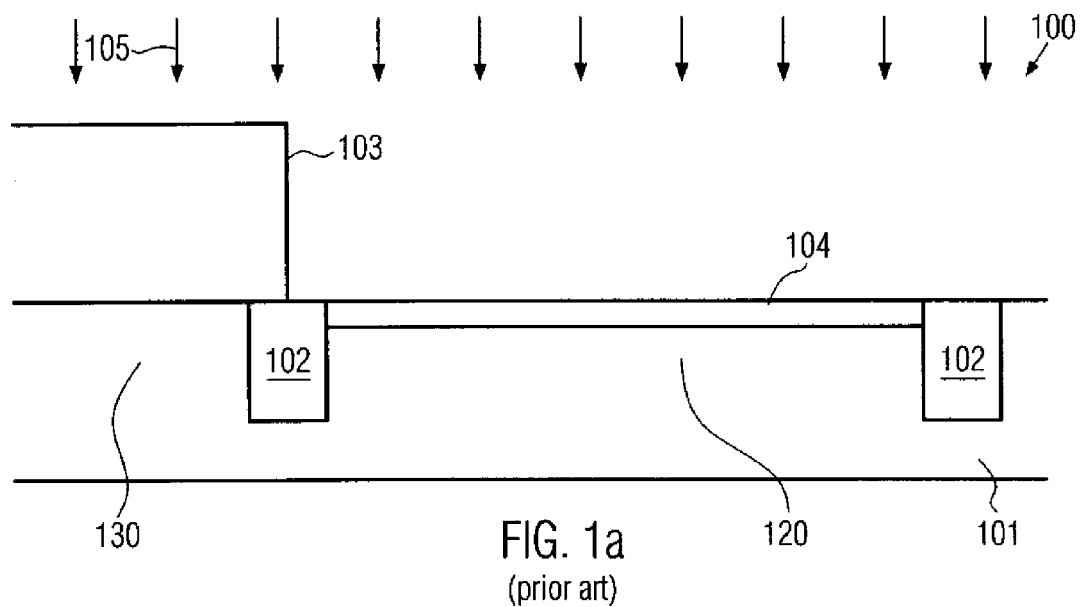
FIGS. 1a-1c schematically show cross-sectional views of a conventional semiconductor device including circuitry and a decoupling capacitor in a conventional planar configuration, thereby requiring a significant amount of die area.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates the formation of three-dimensional or vertically arranged capacitors of high charge carrier storage capability, which in particular embodiments represent decoupling capacitors, which are required for reducing switching noise in high performance semiconductor devices, such as CPUs, ASICs, or any other circuitry including advanced logic circuits involving a lot of switching activities. The three-dimensional or non-planar configuration of decoupling capacitors may significantly reduce the horizontal area occupied by conventional decoupling capacitors of planar configuration, which may entail significant difficulties in patterning highly scaled gate electrode structures, since a highly non-uniform pattern density is created within a die region, thereby also affecting the uniformity of critical etch and photolithography processes owing to the pattern-dependent behavior of these processes.

Figure 2A:
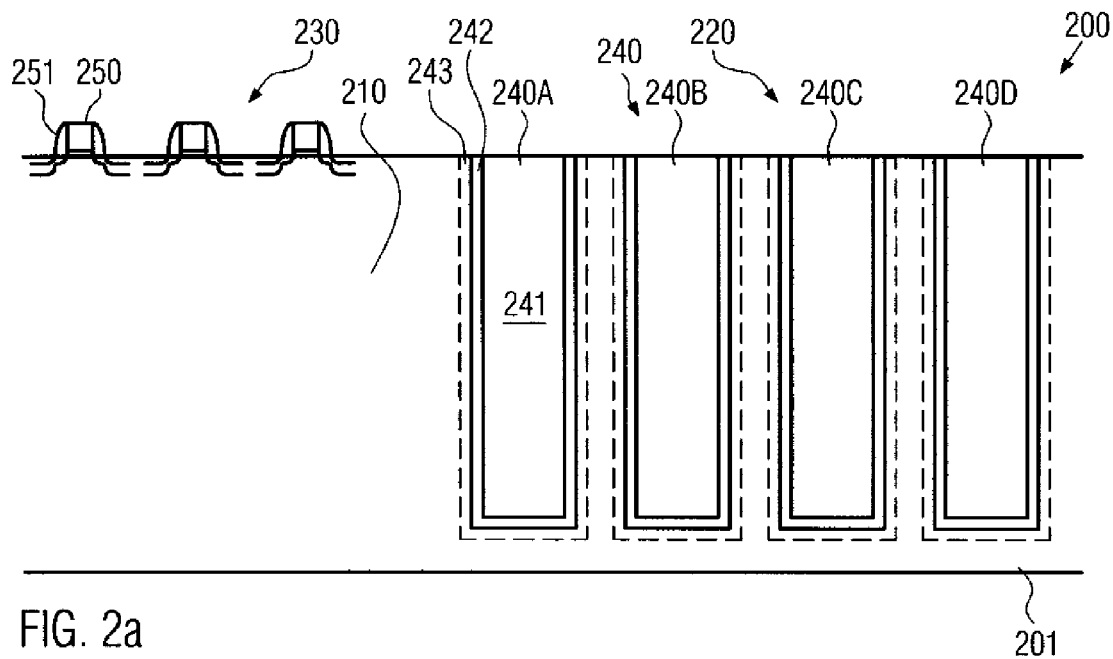
FIGS. 2a and 2c schematically show a cross-sectional view of a semiconductor device including circuitry and a decoupling capacitor of non-planar configuration according to illustrative embodiments of the present invention.

With reference to the accompanying drawings, further illustrative embodiments of the present invention will now be described in more detail. FIG. 2a schematically shows a cross-sectional view of a semiconductor device 200 in an advanced manufacturing stage. The semiconductor device 200 comprises a substrate 201, which may be provided in the form of any appropriate substrate, such as a silicon bulk substrate, a silicon-on-insulator (SOI) substrate, or any other semiconductive or insulating carrier material that is appropriate for forming thereon a substantially crystalline semiconductor layer 210. As the vast majority of complex logic circuitry, such as CPUs, ASICs and other devices including complex logic circuitry, is currently manufactured on the basis of silicon, the semiconductor layer 210 may represent a silicon layer or a silicon-based layer, which may include other materials such as germanium, carbon and the like. Typically, the semiconductor layer 210 comprises an appropriate dopant concentration, which may vary locally in a vertical and lateral direction.

The semiconductor device 200 may further comprise a first die region 230 including a plurality of transistor elements 250, which may form an arithmetic unit, such as a CPU and the like. The device 200 may further comprise a second die region 220, which comprises a capacitor 240 having a high charge carrier storage capability. In one particular embodiment, the capacitor 240 represents a decoupling capacitor, as is typically required in advanced semiconductor devices including fast switching logic circuitry. In one illustrative embodiment, the capacitor 240 may represent a plurality of capacitor elements 240a, 240b, 240c, 240d that may be configured as individual capacitors, while, in other embodiments, the capacitor 240 may comprise the elements 240a, 240b, 240c, 240d as capacitor elements that commonly form the capacitor 240. The capacitor 240, i.e., in the embodiment shown, the individual elements 240a, 240b, 240c, 240d, comprises a first or inner electrode 241, which may be formed of any appropriate conductive material, such as doped polysilicon, metal silicide, metal and the like.

Moreover, a respective dielectric layer 242 is provided, which electrically and physically isolates the inner electrode 241 from an outer electrode 243, wherein, in some embodiments, the outer electrode 243 may be represented by the material of the semiconductor layer 210 surrounding the dielectric layer 242. In other embodiments, the outer electrode 243 may be formed of a material of enhanced conductivity compared to the semiconductor material of the layer 210, wherein the enhanced conductivity may be provided by an increased dopant concentration and/or an appropriate material and the like. For example, the outer electrode 243 may be comprised of highly doped polysilicon, a metal silicide, a metal and the like. The dielectric layer 242, which significantly determines, in addition to the overall electrode surface area of the capacitor 240, the capacitance obtained, may have an appropriate relative permittivity and thickness so as to result, in combination with the total capacitor area, in the desired target capacitance. For instance, a high-k material may be used, possibly in combination with other standard materials such as silicon dioxide, silicon oxynitride, silicon nitride and the like, so as to obtain a high capacitive coupling between the inner electrode 241 and the outer electrode 243 while nevertheless providing a moderately high thickness of the layer 242, thereby reducing static leakage currents of the capacitor 240. For example, high-k materials, such as zirconium oxide, zirconium silicate, hafnium oxide, hafnium silicate and combinations thereof, may be used wherein, in some embodiments, one or more of these high-k materials may be bordered or enclosed by other well-approved dielectric materials, such as silicon nitride, silicon dioxide and the like.

Figure 1C:
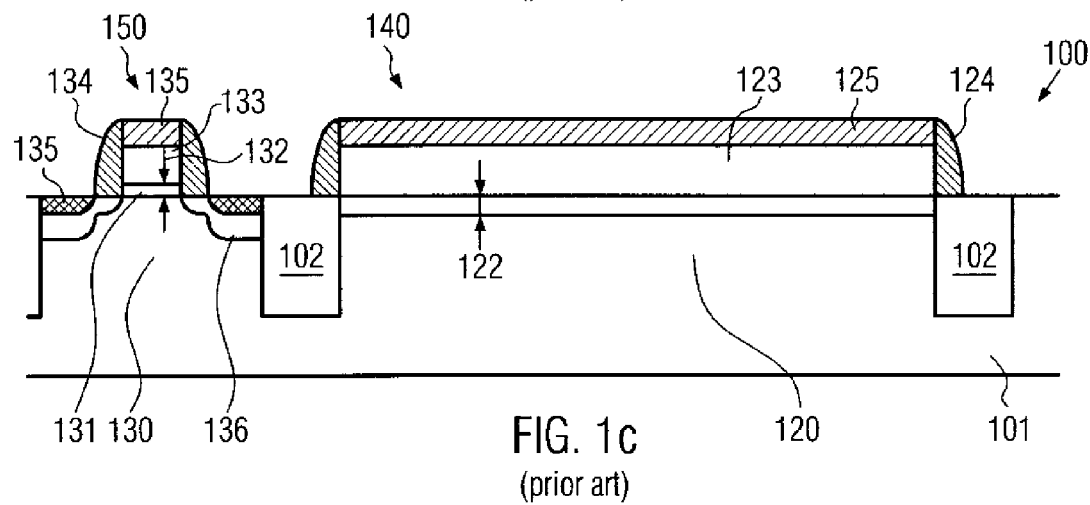
Figure 2B:
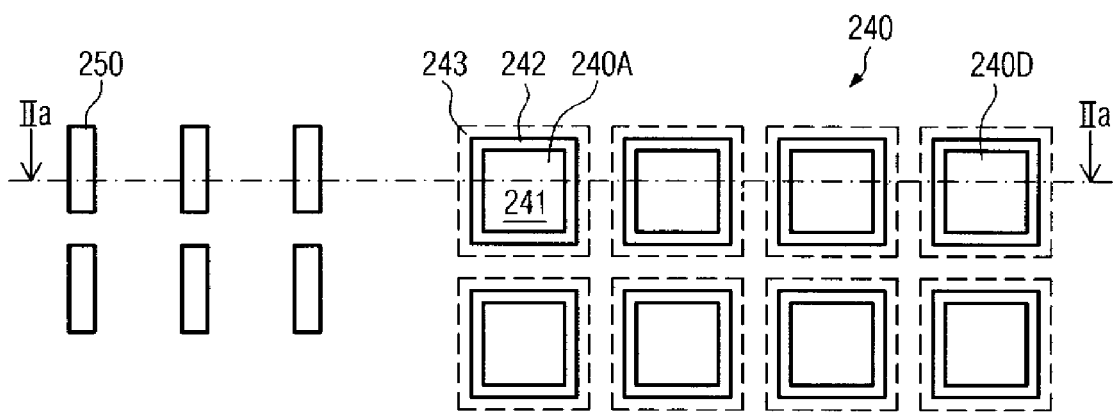

FIG. 2b schematically shows a top view of the device 200 and illustrates the significant increase of capacitance that may be gained for a given area occupied by the capacitor 240 within the die region 220. As is evident, the capacitor 240 occupies an area as is indicated by the dashed line. A conventional device having a decoupling capacitor of a planar configuration occupying the same die area would result in a reduced capacitance, which would also significantly be determined by the material separating an upper and a lower electrode, as is for instance shown and explained with reference to the capacitor 140 in FIG. 1c. According to the present invention, for a given material for the dielectric layer 242 and for a given thickness thereof, which may for convenience be assumed to be identical to that of the gate dielectric 121 in FIG. 1c, a significantly enlarged capacitor area is available due to the non-planar configuration, and, thus, the resulting capacitance is significantly higher. By varying the thickness of the dielectric layer 242 and the material composition thereof, an even increased capacitance and/or significantly reduced leakage current may be achieved compared to a conventional planar arrangement. On the other hand, for a given target capacitance of the capacitor 240, the consumed area in the die region 220 may significantly be reduced so that more floor space is available for other components of the device 200.

A typical process flow for forming the device 200 as shown in FIG. 2a or 2b may comprise the following processes. According to one illustrative embodiment, the high flexibility in forming the capacitor 240 is obtained by first forming at least the gate electrode structures 251 of the plurality of transistor elements 250 and subsequently forming the capacitor 240. In this process regime, the gate electrodes 251 may be formed in accordance with well-established processes involving advanced oxidation and/or deposition recipes for forming a gate insulation layer with a desired thickness and material composition so as to meet device requirements. Thereafter, a layer of gate electrode material may be deposited, such as doped polysilicon, by well-established low pressure chemical vapor deposition (CVD) techniques. Subsequently, the layer of gate electrode material may be patterned by advanced photolithography and etch techniques, wherein the die region 220 may be exposed to an etch atmosphere, thereby substantially completely removing the gate electrode material above the die region 220. As previously explained, the advanced patterning processes for forming the gate electrodes 251 may be sensitive to the pattern density due to micro-loading effects and the like, so that the etch and patterning uniformity may depend on the size of the surface area occupied by the capacitor 240 that is still to be formed. Thus, for a given desired decoupling capacitance, the required floor space is significantly reduced compared to a conventional planar arrangement, and, therefore, the non-uniformity in the pattern density is significantly reduced compared to the conventional device (see FIG. 1c), thereby also improving the overall uniformity of the patterning process for forming the gate electrodes 251.

After the formation of the gate electrodes 251, according to one illustrative embodiment, the transistor formation process may be continued by forming respective drain and source regions by means of ion implantation in accordance with well-established process recipes, wherein intermittently sidewall spacers may be formed so as to appropriately adjust the lateral dopant profile for the individual transistors 250. In other embodiments, the process for forming the transistors 250 may be discontinued after the formation of the gate electrodes 251 and the process flow may be continued by forming the capacitor 240. Irrespective of whether a transistor formation process has been continued or not after the completion of the gate electrodes 251, an appropriate resist mask may be formed which substantially completely covers the die region 230 while providing the required pattern for the capacitor 240, i.e., the respective individual capacitor elements 240a, 240b, 240c, 240d. Based on this resist mask, an anisotropic etch process may be performed to form corresponding recesses, for instance in the form of trenches, in the semiconductor layer 210. For this purpose, process recipes similar to those known from the formation of trench isolation structures may be used. After the formation of the respective recesses or trenches, the resist mask may be removed and subsequently the outer electrode 243 may be formed, for instance by conformally depositing an appropriate material, such as highly doped polysilicon and the like. In other embodiments, the surrounding semiconductor material of the layer 210 may act as the outer electrode 243 without further manipulation or processing. Depending on the process strategy, the outer electrode 243 may be formed, in accordance with other embodiments, so as to contain a metal. For instance, if the formation of the transistor elements 250 is substantially completed or is advanced to a stage in which no further high temperature processes are necessary, a metal may be deposited, such as tungsten, cobalt, nickel, titanium and the like, by well-established physical or chemical vapor deposition techniques, wherein then the metal itself or a compound thereof with the underlying semiconductor material may serve as the outer electrode 243. For example, when the layer 210 is substantially comprised of silicon, a corresponding metal silicide may be formed in accordance with a process strategy as is also known from the formation of metal silicide regions in gate electrodes and drain and source regions of conventional transistor elements.

In one illustrative embodiment, corresponding metal silicide regions in the transistors 250 and the outer electrode 243 may be formed in a common process, thereby significantly reducing process complexity. Thereafter, the dielectric layer 242 may be formed by deposition and/or oxidation, depending on the previous process flow. That is, if the outer electrode 243 is formed of the semiconductor material of the layer 210 or any other oxidizable material, the dielectric layer 242 may be formed by oxidation, provided that the oxidizing temperature is compatible with the manufacturing stage of the transistor elements 250. In other cases, an appropriate dielectric material may be deposited by well-established physical or chemical vapor deposition techniques. For instance, silicon dioxide, silicon nitride, silicon oxynitride and the like may be deposited by plasma enhanced CVD techniques on the basis of well known recipes. During the deposition, the thickness of the dielectric layer 242 may be controlled in accordance with device requirements so as to obtain the desired high capacitance for the capacitor 240. It should be appreciated that the formation of the dielectric layer 242 is substantially decoupled from the process for forming respective gate insulation layers of the gate electrodes 251 and hence any desired thickness and material composition may be selected for the dielectric layer 242.

In one illustrative embodiment, the deposition of the dielectric layer 242 may comprise the deposition of an etch stop layer which exhibits a high etch selectivity with respect to the material used for the inner electrode 241 so that any excess material, which may be formed on the die region 230 during the filling in of the electrode material for the electrode 241, may be reliably removed in a subsequent selective etch process.

In one illustrative embodiment, the inner electrode 241 may be formed by depositing highly doped polysilicon, thereby substantially completely filling the corresponding trenches. Thereafter, excess material may be removed by a selective silicon etch, wherein a corresponding etch stop layer may ensure a reliable removal of the excess material from the die region 230 and 220, while any over etch of the inner electrode 241 may be acceptable and may even improve the reliability of electric insulation between the inner electrode 241 and the outer electrode 243, as a certain recessing of the inner electrode 241 may be created. Thereafter, the further processing for completing the transistor element 250 may be continued and finally corresponding contacts in the die region 230 and the die region 220 may be formed, wherein well-established process recipes may be used in combination with correspondingly designed photolithography masks to thereby establish the required electrical connections between the individual capacitor elements 240a, 240b, 240c, 240d and the circuitry represented by the plurality of transistor elements 250.

Figure 2C:
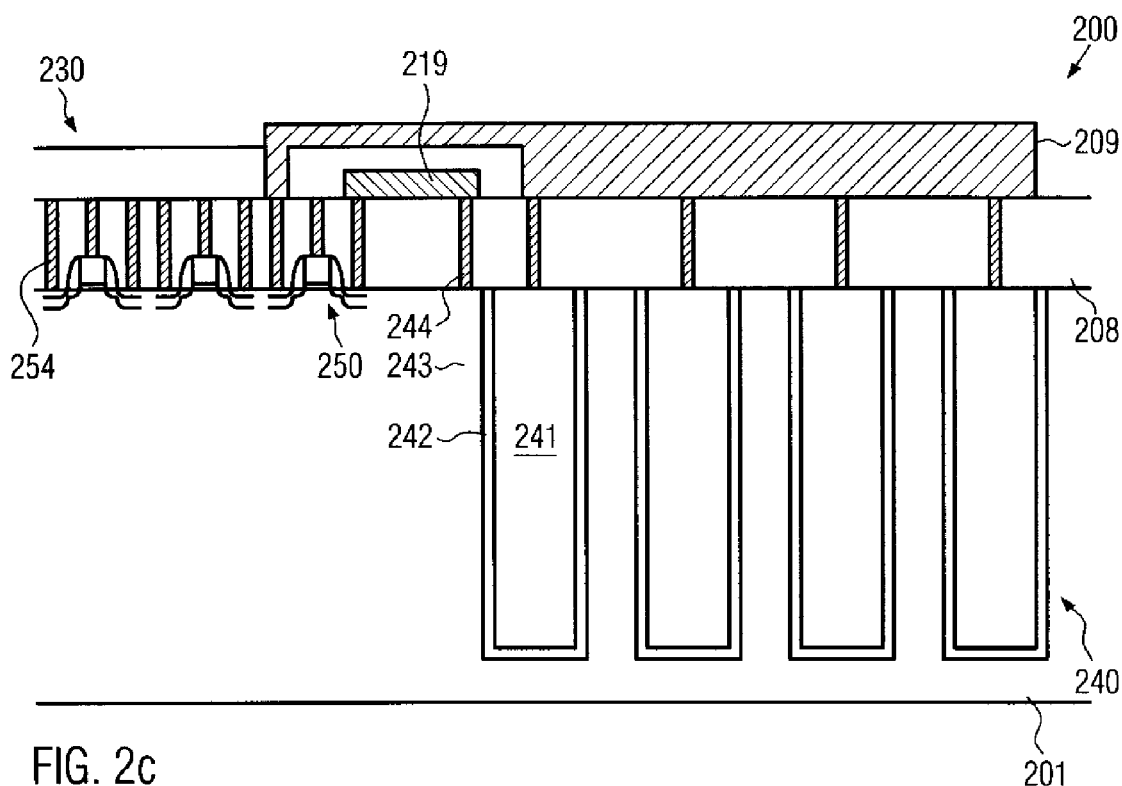

FIG. 2c schematically shows an illustrative example of a wiring scheme for connecting the decoupling capacitor 240 to the logic circuitry represented by the transistors 250. Consequently, the device 200 may comprise a plurality of transistor contacts 254, which are formed in a dielectric layer 208 and which connect to corresponding drain and source regions and gate electrodes of the plurality of transistors 250. Moreover, capacitor contacts 244 are formed within the dielectric layer 208, which may provide electrical contact to the inner electrodes 241 and the outer electrodes 243, respectively. In the embodiment shown, only one contact 244 is illustrated for connecting to the outer electrode 243, which may be assumed to be in contact with all of the individual capacitor elements 240a, 240b, 240c, 240d. In other embodiments, respective capacitor contacts for a plurality of outer electrodes 243 may be provided. The capacitor contact 244 connecting to the outer electrode 243 may also be connected to a metal line 219, which in turn provides electrical contact to the logic circuitry represented by the plurality of transistor elements 250. Similarly, the plurality of inner electrodes 241 may be connected, via respective contacts 244, to one or more metal lines 209, which in turn provide electrical contact to a specified portion of the circuitry represented by the transistor elements 250, as may be required for the decoupling function of the capacitor 240. It should be appreciated that the wiring scheme shown in FIG. 2c is of illustrative nature only, and any other structure for connecting the capacitor 240 with appropriate nodes of the circuitry represented by the transistor elements 250 may be used. For instance, two or more of the individual capacitor elements 240a, 240b, 240c, 240d may be connected with different nodes in the circuitry of the transistor elements 250.

As previously noted, the transistor contacts 254 and the capacitor contacts 244 may be formed on the basis of well-established recipes and may, in a particular embodiment, be formed in a common manufacturing process. For this purpose, an etch stop layer (not shown) may be conformally deposited over the die regions 230 and 220 followed by the deposition of the dielectric layer 208, which may then be polished or otherwise planarized if a highly uniform surface topography is required. Thereafter, corresponding openings may be formed in the layer 208, which may then be etched through the etch stop layer to provide contact to the respective semiconductor regions. Thereafter, an appropriate conductive material may be filled into the openings to thereby form the transistor contacts 254 and the capacitor contacts 244. Thereafter, the metal lines 219 and 209 may be formed in accordance with well-established techniques for forming metallization layers of semiconductor devices.

During the formation of the metal lines 209 and 219, which are embedded in an appropriate interlayer dielectric material, anisotropic etch techniques are typically performed on the basis of a plasma ambient, during which plasma-induced damage may be observed. In particular, for highly advanced semiconductor devices having minimum feature sizes of 100 nm and even less, the metal lines 209 and 219 may be comprised of copper or copper alloys, thereby requiring specific strategies owing to the specific characteristics of copper with respect to deposition and etching. For example, for copper-based metallization layers, the so-called damascene approach is frequently used, in which the interlayer dielectric material is deposited and patterned to receive vias and trenches, which are then subsequently filled with copper or copper alloys. During the patterning process, plasma-induced wafer damage is frequently observed, in particular during the critical via etch process. It is believed that one reason for significant wafer arcing and wafer charging effects is caused by excessive conductive areas of underlying layers, which may induce an antenna effect during the plasma-assisted etch process. According to the significantly reduced horizontal surface area occupied by the decoupling capacitor 240 compared to a conventional planar configuration (see FIG. 1c), the antenna effect is remarkably reduced, thereby also reducing the risk for any plasma-induced damage, such as wafer arcing and wafer charging.

Again referring to FIG. 2a, it should be appreciated that the semiconductor device 200 as shown in FIG. 2a may, in other embodiments, be formed by forming the capacitor 240 prior to forming the plurality of transistor elements 250. Hereby, a substantial decoupling of the process flow for forming the capacitor 240 from the processes for forming the transistor elements 250 may be obtained, provided that the capacitor 240 is compatible with any high temperature processes that may be required for the formation of the transistor elements 250. In one illustrative embodiment, the capacitor 240 may be formed on the basis of trench isolation techniques, thereby providing the capacitor 240 in a form that is compatible with the further conventional process flow for forming the transistor elements 250. For this purpose, prior to or after the formation of any trench isolation structures, the capacitor 240 may be formed by a process flow including an anisotropic trench etch process and a subsequent deposition process for forming the outer electrode 243, for instance in the form of doped polysilicon, if the inherent conductivity of the semiconductor layer 210 is considered inappropriate. Thereafter, the dielectric layer 242 may be formed by oxidation and/or deposition to form silicon dioxide, silicon oxynitride or silicon nitride. Thereafter, the inner electrode 243 may be formed by depositing polysilicon and by removing any excess material by corresponding etch and chemical mechanical polishing (CMP) techniques. Thereafter, the manufacturing process may be resumed with standard recipes to form the transistor elements 250. The further processing can then be continued as is also described above to form the device 200 as shown in FIG. 2c.

With reference to FIGS. 3a-3e, further illustrative embodiments of the present invention will now be described in more detail, wherein many of the process steps described and involved may also be applied in the previously described embodiments or in the embodiments described later on with reference to FIGS. 4a and 4b, as well as FIG. 5. In the previously described embodiments, the manufacturing processes for forming the non-planar capacitor may be performed entirely prior to the formation of any transistor elements or may be performed after the formation of an electrode structure. With reference to FIGS. 3a-3e, a process strategy will be described that enables the formation of the non-planar decoupling capacitor by using at least some process steps, which are also employed for the formation of a gate electrode structure.

Figure 3A:
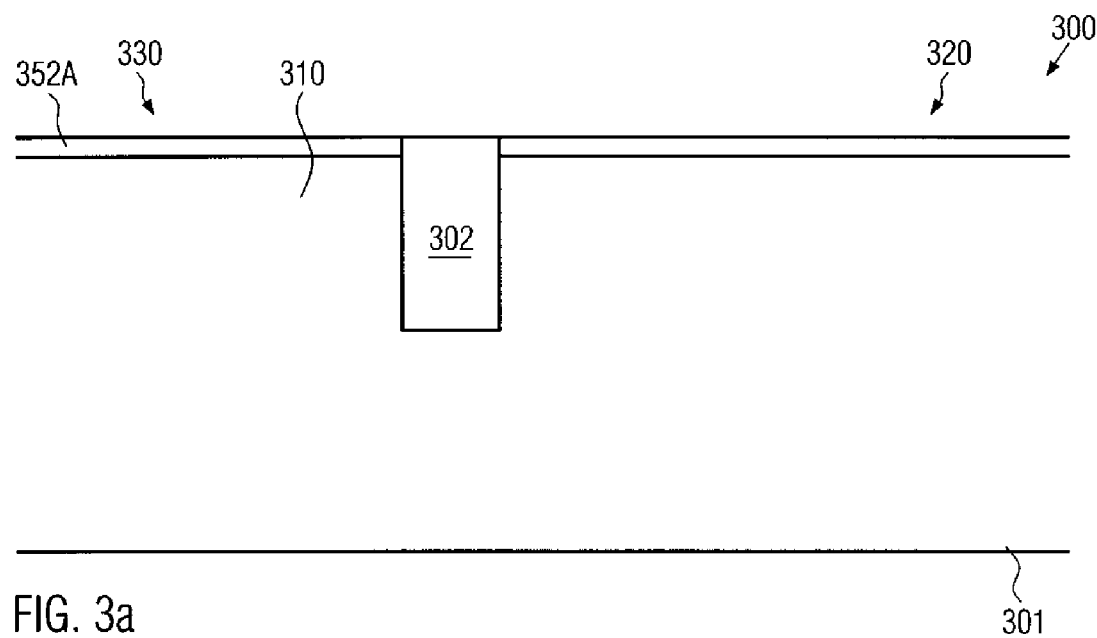
FIGS. 3a-3e schematically show cross-sectional views of a semiconductor device including circuitry and a decoupling capacitor during various manufacturing stages in accordance with illustrative embodiments of the present invention, wherein the three-dimensional configuration of the decoupling capacitor is formed in a process that is substantially compatible with a conventional gate patterning process.

In FIG. 3a, a semiconductor device 300 comprises a substrate 301 having formed thereon a semiconductor layer 310. Moreover, a trench isolation structure 302 may be formed in the semiconductor layer 310. The trench isolation 302 may separate a first die region 330 from a second die region 320. Furthermore, in one illustrative embodiment, a first portion 352a of a gate insulation layer 352 may be formed on the semiconductor layer 310. In this embodiment, the gate insulation layer to be formed in the first die region 330 has a target thickness that is greater than the thickness of the first portion 352a. In other embodiments, the first portion 352a may not be formed at this stage of manufacture and the process steps for patterning the second die region 320 for receiving a vertical or three-dimensional non-planar decoupling capacitor may be performed as described below without the portion 352a. The device 300 as shown in FIG. 3a may be formed in accordance with well-established trench isolation techniques involving sophisticated photolithography, etch, deposition and planarization techniques.

Figure 3B:
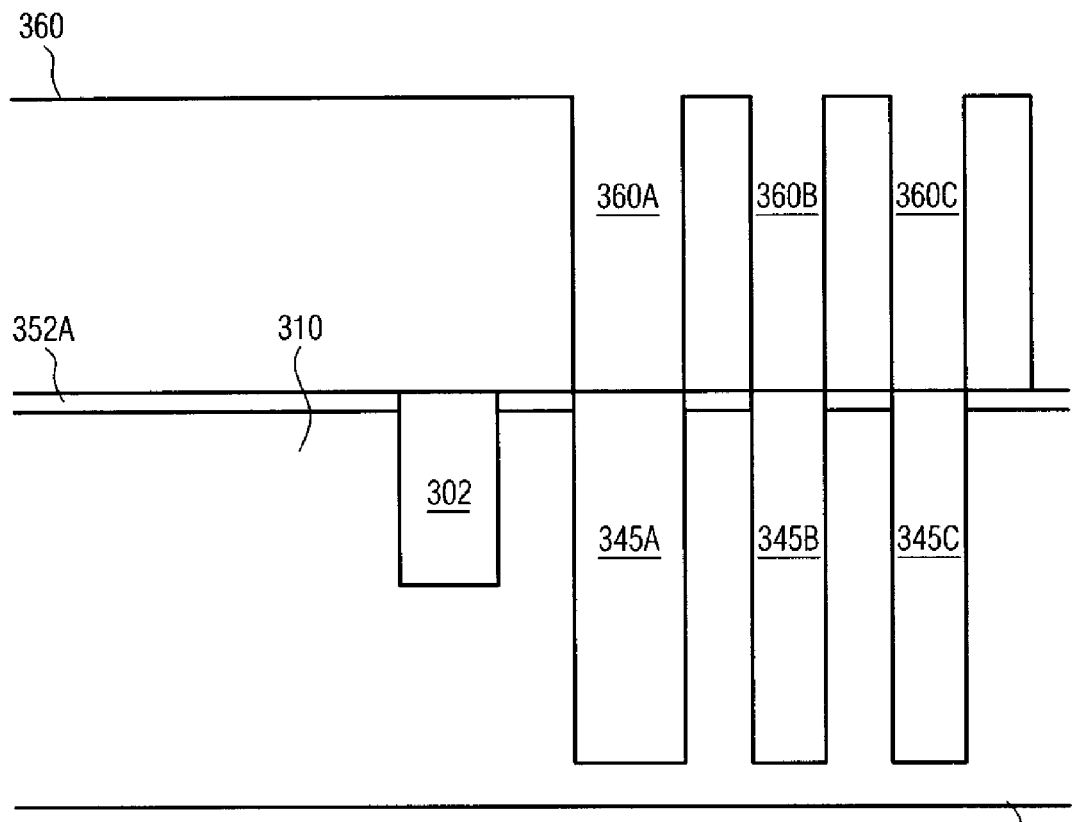

FIG. 3b schematically shows the semiconductor device 300 in a further advanced manufacturing stage. The device 300 comprises an etch mask 360, which may be provided in the form of a resist mask or any other appropriate hard mask. The etch mask 360 comprises a plurality of openings 360a, 360b, 360c. Corresponding recesses or openings 345a, 345b, 345c are formed in the semiconductor layer 310. The recesses 345a, 345b, 345c may have the form of trenches or any other appropriate shape, such as, for example, shown in FIGS. 2a and 2b. The dimensions of the recesses 345a, 345b, 345c as well as their number are selected such that, in combination, the required capacitance is achieved for a given material composition and layer thickness of a capacitor dielectric still to be formed. The trenches may be the same size or they may vary in size.

The etch mask 360 may be formed by well-established photolithography techniques followed by well-established anisotropic etch techniques to from the recesses 345a, 345b, 345c, wherein process recipes may be used that are similar to those used for the formation of the trench isolation structure 302. That is, depending on whether or not the first portion 352a of the gate insulation layer is provided on the semiconductor layer 310, the gate insulation layer 352 in the second die region 320 is to be opened and subsequently the semiconductor material is etched in a highly anisotropic procedure. Thereafter, the resist mask 360 may be removed by well-known wet or dry resist strip techniques or any other selective etch processes, when the etch mask 360 is provided in the form of a hard mask.

Figure 3C:
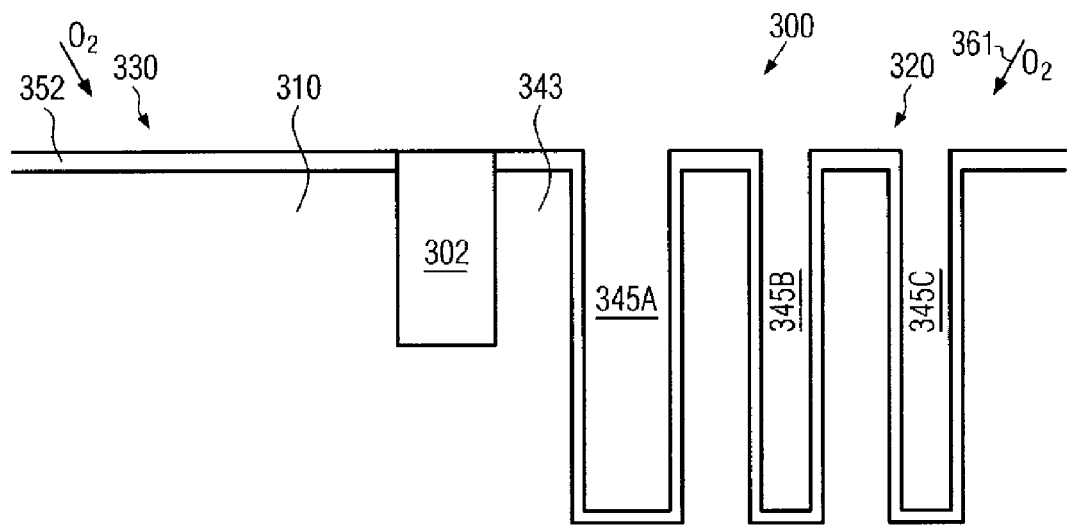

FIG. 3c schematically shows the semiconductor device 300 during the formation of a dielectric layer 342 within the capacitor recesses 345a, 345b, 345c. During this process, indicated as 361, the thickness of the first portion 352a (see FIG. 3b) may be increased so as to obtain the final thickness of the gate insulation layer 352. For example, the process 361 may represent an oxidation process for growing an oxide with a specified thickness so as to adjust a capacitive coupling between the interior of the recesses 345a, 345b, 345c and an exterior region, indicated as 343, which will act as an outer electrode after the completion of the decoupling capacitor. For instance, the dielectric layer 342 may be provided as a moderately thin layer having a thickness of approximately 1 nm to several nm, depending on device requirements. It should be appreciated that the thickness of the first portion 352a may be selected in an appropriate manner in order to obtain the target thickness of the gate insulation layer 352 after the formation of the dielectric layer 342. In other embodiments, when the first portion 352a is not formed prior to formation of the recesses 345a, 345b, 345c, the gate insulation layer 352 and the dielectric layer 342 may be formed in a single common process so that these layers have substantially the same characteristics.

Figure 3D:
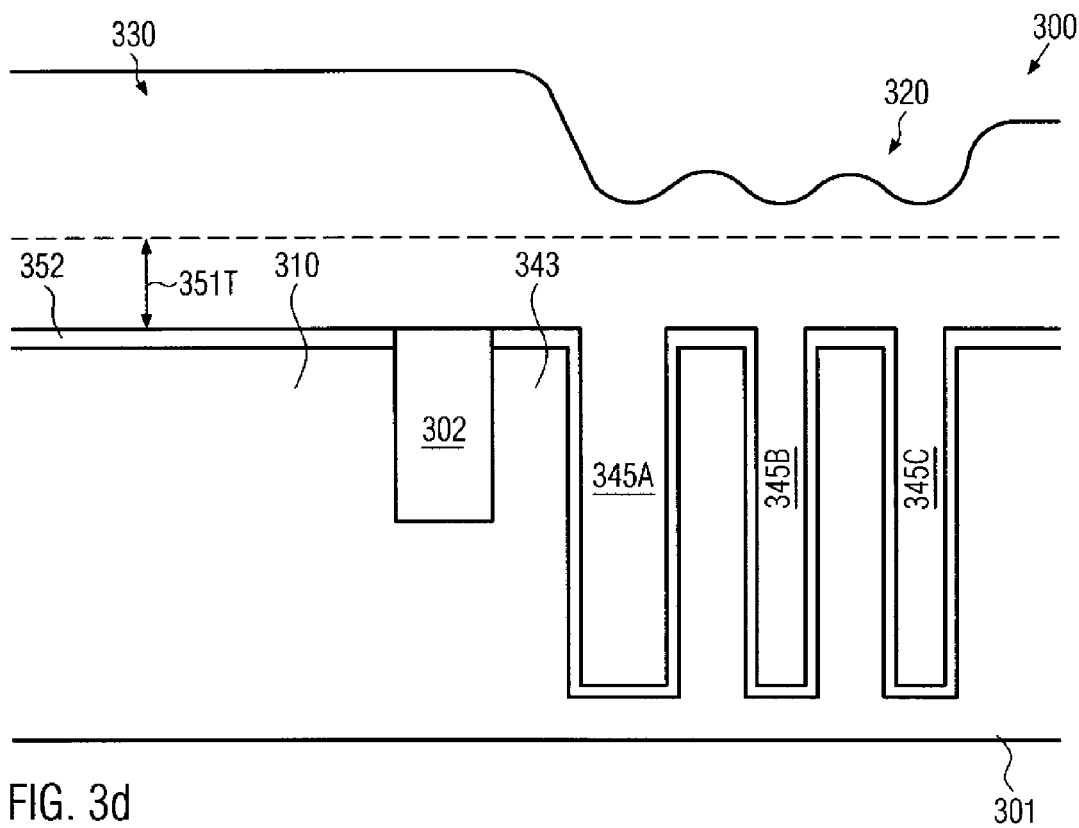

FIG. 3d schematically shows the semiconductor device 300 with a layer of gate electrode material 351 formed above the first and second die regions 330 and 320. The layer 351 may be comprised of doped polysilicon as is frequently used in highly advanced CMOS techniques. Moreover, the layer 351 may exhibit a specific topography due to the presence of the recesses 345a, 345b, 345c, which are substantially completely filled by the material of the layer 351. Consequently, the layer 351 may be deposited with an excess thickness that is higher than a target thickness 35 it for a gate electrode structure to be formed in the first die region 330. The layer 351 may be formed by well-established low pressure CVD techniques. Thereafter, the topography of the layer 351 may be planarized by CMP to substantially obtain the target thickness 351t. Next, the planarized layer 351 may be patterned by well-established photolithography and etch techniques to form gate electrode structures in the first die region 330. In some illustrative embodiments, the patterning process for the gate electrode structures may be modified so as to also form respective electrode structures above the recesses 345a, 345b, 345c, thereby increasing even more the uniformity of the resulting pattern density during the patterning process for the gate electrode structures. Moreover, the patterning of electrodes above the corresponding recesses 345a, 345b, 345c may be performed in such a manner that a desired electrical connection between the individual recesses 345a, 345b, 345c in accordance with the desired electrical configuration is established.

Figure 3E:
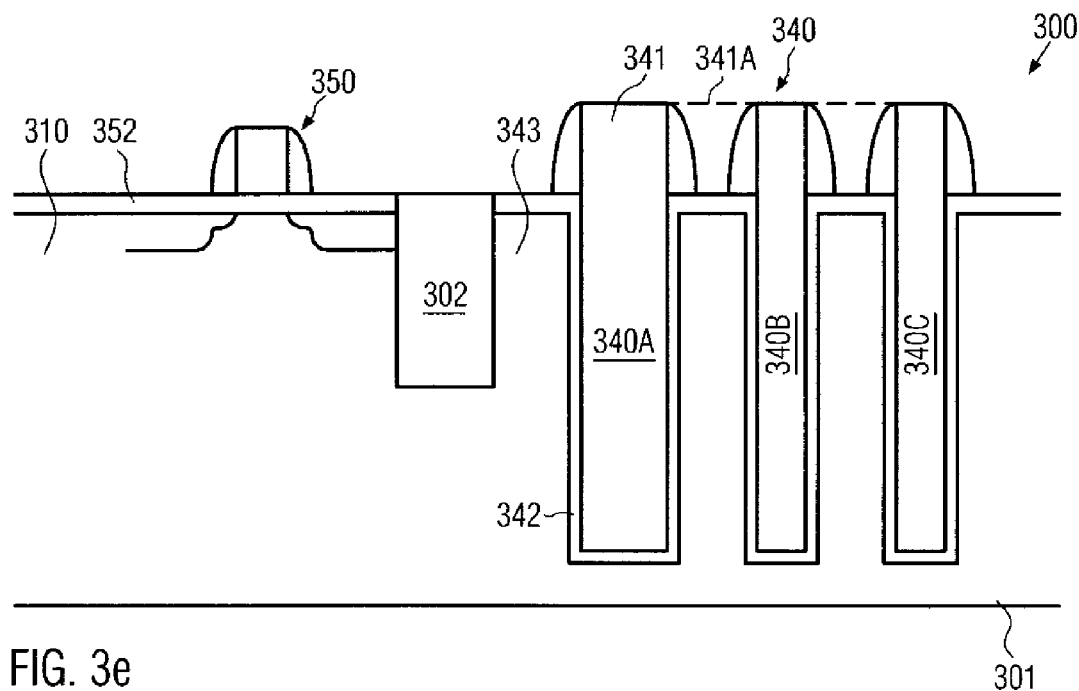

FIG. 3e schematically shows the semiconductor device 300 after the above-described process sequence and after any ion implantation processes and spacer formation sequences. Thus, the device 300 comprises a plurality of transistors 350, of which, for convenience, only one element is shown. The transistors 350 may represent a complex logic circuitry, such as an arithmetic unit, a CPU and the like. Moreover, a capacitor 340, which may comprise individual capacitor elements 340a, 340b, 340c is formed in the second die region 320. The capacitor elements 340a, 340b, 340c may have electrodes 341 which, in some embodiments, may have been commonly patterned with the gate electrode 351 of the transistors 350. As previously explained, the electrodes 341 may be electrically connected in any appropriate manner, as indicated by the dashed line 341a in the form of local interconnects to provide the desired electrical configuration of the capacitor 340.

Figure 1B:
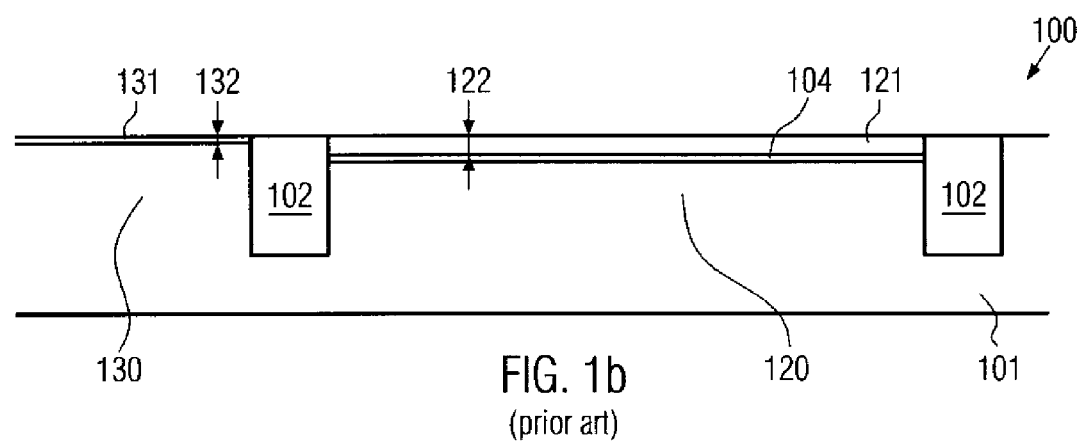

As a result, the capacitor 340 may be formed by well-established process techniques, wherein a high degree of compatibility with the conventional process flow, as described with reference to FIGS. 1a-1c, is maintained, while nevertheless providing significant advantages due to the non-planar configuration of the decoupling capacitor 340. Moreover, the patterning of the electrodes 341 in a common patterning process with the gate electrodes 351 significantly increases the uniformity of the pattern density, thereby also significantly contributing to an enhanced process control during the critical photolithography and etch techniques. Moreover, local interconnect structures, such as the connections 341a, may be formed during the gate patterning process, thereby electrically connecting the individual capacitor elements 340a, 340b, 340c in a highly efficient manner. Furthermore, if the conductivity of the outer electrodes 343 is considered inappropriate on the basis of the initial doping concentration of the semiconductor layer 310, a corresponding ion implantation process may be performed with appropriate dose and energy for locating a dopant species along the vertical portion of the dielectric layer 342, while the first die region 330 may be covered by a corresponding resist mask.

Figure 4A:
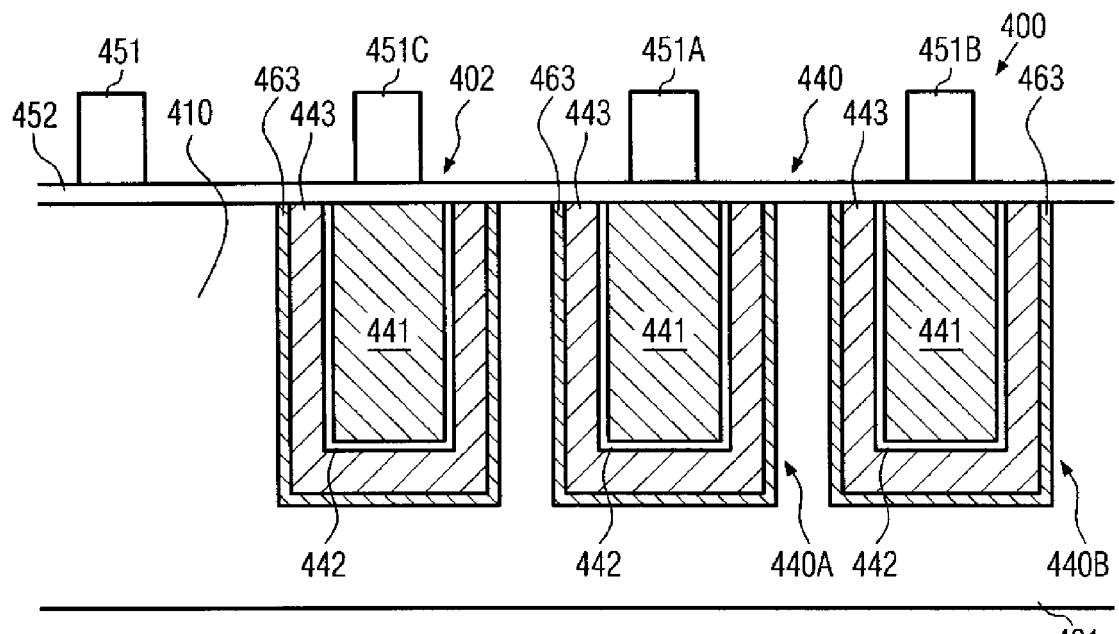
FIGS. 4a-4b schematically show a cross-sectional view and a top view, respectively, of a decoupling capacitor and a trench isolation structure which are formed in a common manufacturing process according to further illustrative embodiments of the present invention.
Figure 4B:
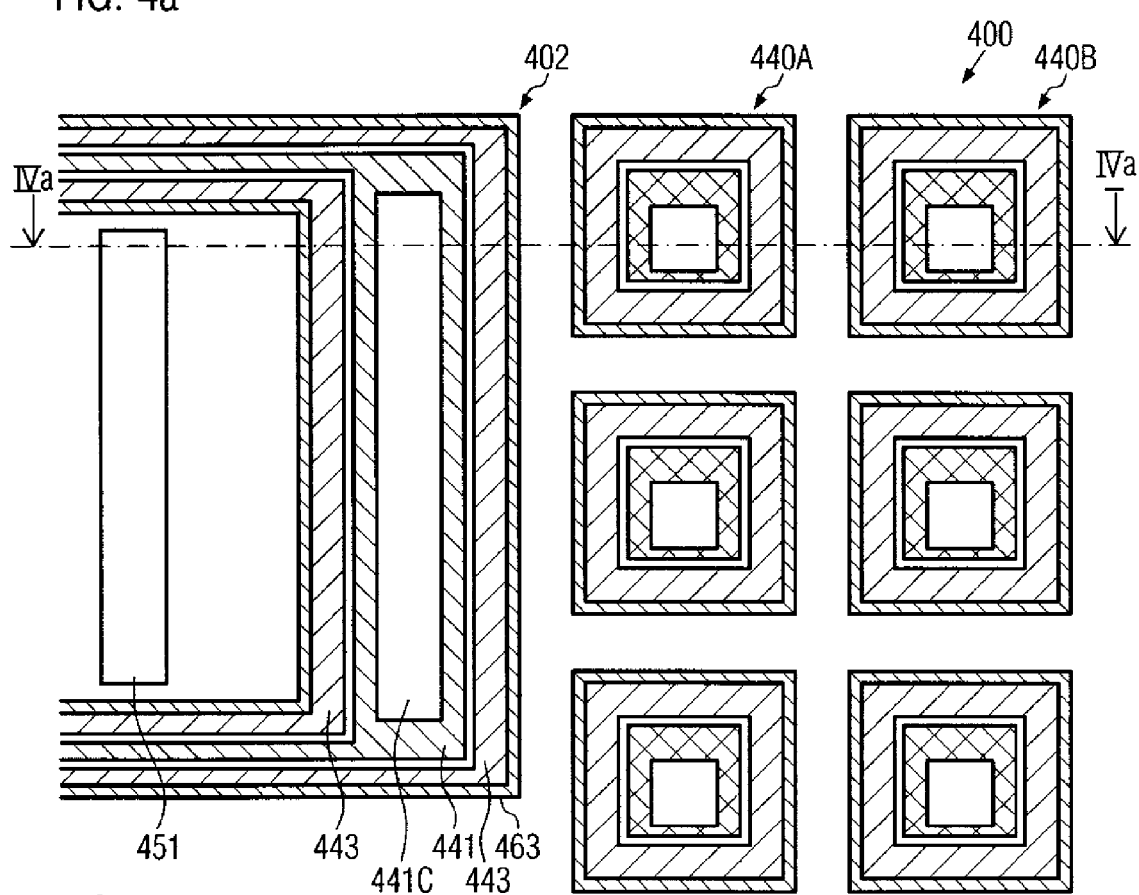

With reference to FIGS. 4a and 4b, further illustrative embodiments will now be described, wherein the formation of trench isolation structures is appropriately modified so as to also form a corresponding decoupling capacitor.

FIG. 4a schematically shows a cross-sectional view of a semiconductor device 400 comprising a substrate 401 having formed thereon a semiconductor layer 410. With respect to the substrate 401 and the semiconductor layer 410, the same criteria apply as previously described with reference to the substrate 201 and the layer 210. The device 400 comprises a trench isolation structure 402 and a three-dimensional decoupling capacitor 440 in the semiconductor layer 410. In this embodiment, the trench isolation structure 402 and the decoupling capacitor 440, including a first element 440a and a second element 440b, may have, in principle, substantially the same configuration. Consequently, the trench isolation structure 402 may also be considered as a capacitor element. The isolation structure 402 and the capacitor elements 440a, 440b each comprise an isolation layer 463, which separates the interior of the respective elements from the surrounding semiconductor layer 410. For example, the isolation layer 463 may be formed of silicon dioxide and/or silicon nitride and/or silicon oxynitride and the like. In any case, the isolation layer 463 is formed from an insulating material so that the isolation layer 463 of the trench isolation structure 402 meets the required insulating characteristics as is, for instance, required for trench isolation structures 302, 202 and 102, as previously described. Moreover, the elements 402, 440a, 440b further comprise an outer electrode 443, a dielectric layer 442 and an inner electrode 441. The inner and outer electrode 443, 441 may be formed from the same material or from different materials, such as doped polysilicon and the like. The dielectric layers 442 may be comprised of any appropriate material, such as silicon dioxide, silicon nitride, silicon oxynitride, or any high-k materials as are already described above. It should be appreciated that the dielectric layers 442 may be comprised of a plurality of materials and/or different layers to provide the desired characteristics in terms of capacitive coupling and leakage current. The device 400 may further comprise a gate insulation layer 452 and a gate electrode 451. In some illustrative embodiments, one or more of the elements 402, 440a, 440b may comprise a corresponding "electrode" structure 451c, 451a, 451b, whereas in other embodiments some or all of these electrode structures may be omitted.

FIG. 4b schematically shows a top view of the device 400, wherein an exemplary configuration of the capacitor elements 440a, 440b is shown. It should be appreciated that the above arrangement comprising a plurality of substantially square-shaped elements 440a, 440b is of illustrative nature only and other geometric configurations and forms may be selected. For instance, a substantially rectangular outline may be selected for the capacitor elements 440a, 440b. Moreover, as is evident from FIG. 4b, the trench isolation structure 402 encloses the gate electrode 451 and thus defines a region in which a transistor is to be formed adjacent to the gate electrode 451.

A typical process flow for forming the device 400 as shown in FIGS. 4a and 4b may comprise the following processes. First, corresponding trenches may be formed similarly as in conventional trench isolation processes wherein, however, in some embodiments, the dimensions of the isolation trenches may be adapted to comply with the desired configuration of the isolation structure 402. For example, the trench width may be correspondingly increased to accommodate the inner and outer electrodes 441, 443 and the dielectric layer 442 as well as the isolation layer 463. In other embodiments, standard isolation trench dimensions may be appropriate for accommodating the corresponding capacitor elements. Moreover, respective trenches or recesses for the elements 440a and 440b may be formed, wherein the dimensions thereof may not necessarily correspond to the dimensions of the isolation trenches. For example, the trench width, i.e., in FIG. 4a, the horizontal extension of the elements 402, 440a, 440b, may differ from each other in accordance with design requirements. Irrespective of the dimensions of the individual elements 402, 440a, 440b, these components may be formed in a common etch process in accordance with recipes that are well established for forming trench isolation structures. Thereafter, the isolation layers 463 may be formed, for instance by performing a controlled oxidation process and/or by depositing any appropriate insulating material, such as silicon dioxide, silicon oxynitride, silicon nitride and the like. Next, the material for the outer electrodes 443 is conformally deposited, for instance in the form of highly doped polysilicon or any other conductive material that is appropriate for withstanding subsequent high temperature processes as may be required for the formation of transistor structures. Next, the dielectric layers 442 may be formed by oxidation and/or deposition wherein, as previously explained, a plurality of different materials or material layers may be formed to obtain the required characteristics. Next, the material for the inner electrodes 441, such as highly doped polysilicon and the like, may be deposited, thereby reliably filling the remaining volume of the respective trenches and openings. Subsequently, any excess material may be removed by etching and/or CMP in a similar manner as in conventional trench isolation processes. Thereafter, the gate insulation layer 452 may be formed on the basis of well-established recipes including highly controlled oxidation and/or deposition processes. Next, the gate electrode 451 may be formed by depositing the gate electrode material, such as polysilicon, which is then patterned in accordance with sophisticated lithography and etch techniques on the basis of conventional recipes. Contrary to conventional techniques, the lithography mask for patterning the gate electrode 451 may also provide for the additional "electrode" structures 451c, 451a, or 451b, which may then provide a highly uniform pattern density during the patterning process.

As may be seen from FIG. 4b, the respective gate electrode structures 451a, 451b, if provided, may be formed such that sufficient space is available for contacting the inner electrodes 441 adjacent to the respective structures 451a, 451b. The further processing, i.e., the formation of complete transistor structures on the basis of the gate electrode 451, may then be continued in a similar fashion as is already described above. During the formation of transistor contacts, corresponding contacts for the capacitor 440 also may be formed and a desired electrical configuration may be established in a similar way as is described with reference to FIG. 2c.

It should be appreciated that the above-described embodiments provide the possibility of substantially completely decoupling the formation process for forming the capacitor 440 from the manufacturing process of any circuit elements, while nevertheless a high degree of compatibility to conventional process flows is maintained. Moreover, in some embodiments, the trench isolation structure 402 may be efficiently used as decoupling capacitor, wherein, in some embodiments, the correspondingly obtained capacitor area may suffice for decoupling purposes while in other embodiments the additional capacitor elements 440a, 440b are provided. In still other embodiments, the trench isolation structures 402 may not be electrically contacted so as to not act as a capacitive element. It should also be appreciated that the embodiments described above are also applicable to SOI substrates. The same holds true for the embodiments described with reference to FIGS. 2a-2c and 3a-3e. However, in advanced semiconductor devices based on SOI technology, the corresponding semiconductor layer may only exhibit an extremely small thickness, such as several tenths of nm, which may unduly restrict the available capacitor area obtained by a three-dimensional decoupling capacitor arrangement. In this case, in some embodiments, the capacitor may be formed to extend beyond a buried insulation layer of the SOI substrate.

Figure 5:
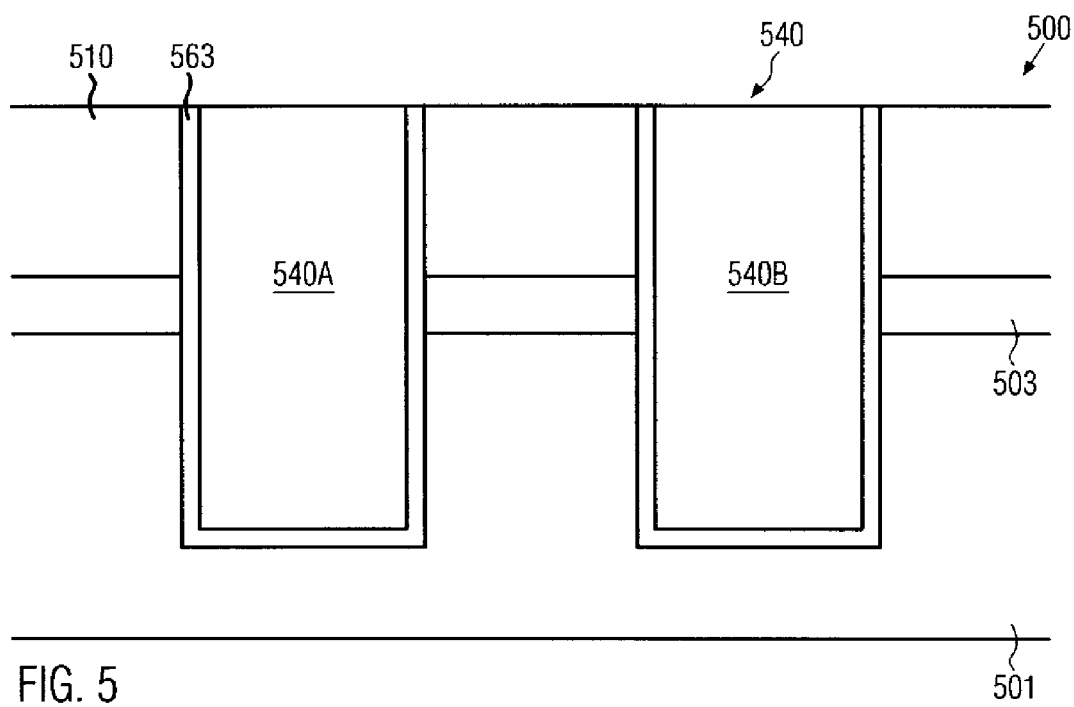
FIG. 5 schematically shows a cross-sectional view of an SOI device, in which the decoupling capacitor extends through the buried insulation layer in accordance with yet other illustrative embodiments of the present invention.

FIG. 5 schematically shows a cross-sectional view of a semiconductor device 500 comprising a substrate 501 having formed thereabove a semiconductor layer 510, which is separated from the substrate 501 by a buried insulation layer 503. In particular embodiments, a configuration of the substrate 501, the buried insulation layer 503 and the semiconductor layer 510 may represent an SOI substrate. The device 500 further comprises a decoupling capacitor 540 including capacitor elements 540a, 540b. The corresponding elements 540a, 540b represent, in this manufacturing stage, recesses extending through the semiconductor layer 510, the buried insulation layer 503 and into the substrate 501. Depending on the configuration of the capacitor 540, the recesses 540a, 540b may have formed on inner surfaces thereof an isolation layer 563 when the capacitor 540 is to be formed in a similar configuration as is described above with reference to FIGS. 4a and 4b. In other embodiments, the capacitor elements 450a, 450b may be formed in accordance with the configurations as described with reference to FIGS. 2a-2c and 3a-3e so that the isolation layer 563 may be omitted, especially if the elements 540a, 540b are provided in a separate die region that is enclosed by an appropriate isolation structure. In this case, the layer 563 may represent an outer electrode of the capacitor elements 540a, 540b.

The device 500 may be formed, depending on device and process requirements, in the following way. A well-approved anisotropic etch process may be performed to etch through the semiconductor layer 510, wherein the etch chemistry may be changed to efficiently etch through the buried insulation layer 503. Thereafter, the trench etch process may be resumed on the basis of an appropriate etch chemistry to remove material from the substrate 501. For instance, if the semiconductor layer 510 is substantially comprised of silicon and the substrate 501 represents a crystalline silicon substrate, the same etch parameters may be used for etching through the layer 510 and into the substrate 501. After a desired depth is achieved, the etch process may be discontinued and further processing may be resumed by forming the layer 563 in the form of an isolation layer or an outer electrode layer, depending on process and device requirements. In some embodiments, substantially the same process strategy may be carried out as is also described with reference to FIGS. 4a and 4b, wherein one or more of the elements of the capacitor 540 may be designed as trench isolation structures, such as the structure 402. It should be appreciated that extending the corresponding isolation structure into the substrate 501 may substantially not negatively affect the functionality of the corresponding trench isolation structure. In other embodiments, a process strategy may be followed as is described with reference to FIGS. 2a-2c and 3a-3e, wherein separately formed trench isolation structures may be obtained in a conventional fashion, while the capacitor elements 540a, 540b may be formed so as to extend into the substrate 501 for providing a high capacitance while still occupying a minimum amount of chip area. The further processing for completing the decoupling capacitor 540 may be performed as is described above.

As a result, the present invention provides a technique that enables the formation of decoupling capacitors occupying a significantly reduced die area compared to conventional planar configurations. Moreover, by forming three-dimensional decoupling capacitors in complex logic circuitry, a high degree of flexibility in forming semiconductor devices is offered, since, in many embodiments, the formation of the capacitor dielectric is substantially independent from the formation of corresponding gate insulation layers. That is, the thickness and/or the material composition of the capacitor dielectric may in some embodiments be selected in view of enhanced capacitor behavior rather than with respect to the characteristics of the gate insulation layers. In other embodiments, the formation of the non-planar decoupling capacitors may be incorporated into conventional process strategies for forming gate electrode structures or trench isolation structures, thereby significantly reducing the total process complexity while still providing significant advantages, such as enhanced process uniformity, die area consumption and the like. Due to the reduced die area consumed by the capacitor, the non-uniformity of the pattern density during the critical gate patterning process may be significantly reduced and may be even further reduced in some embodiments when corresponding electrode structures are formed over corresponding capacitor elements. Additionally, wafer arcing issues encountered in typical back-end processes, such as during the formation of metallization layers, may significantly be relaxed due to the reduced antenna effect of the significantly smaller horizontal die area occupied by the decoupling capacitors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a recess in a semiconductor layer;
   forming a first portion of an insulation layer on said semiconductor layer and on an exposed surface of said recess;
   forming a plurality of transistor elements in and on said semiconductor layer, said plurality of transistor elements defining an arithmetic unit, wherein said insulation layer formed on said semiconductor layer defines a gate dielectric layer for said plurality of transistor elements;
   forming a decoupling capacitor in said recess, wherein said first portion of said insulation layer formed on said exposed surface defines a dielectric layer of said decoupling capacitor;

depositing a conductive material to fill said recess;
planarizing a surface topography of said conductive material to form a conductive layer;
patterning said conductive layer to define gate electrodes of said plurality of transistor elements and to define an electrode portion for an inner electrode of said decoupling capacitor in a common patterning process, wherein said electrode portion extends above a surface of the semiconductor layer; and
connecting said decoupling capacitor to said arithmetic unit.

2. The method of claim 1, wherein forming said capacitor comprises depositing a conductive material on said dielectric layer.

3. The method of claim 1, wherein forming said insulating layer comprises oxidizing said semiconductor layer.

4. The method of claim 1, wherein forming said dielectric layer comprises depositing one or more dielectric materials.

5. The method of claim 1, further comprising forming a trench isolation structure by etching a trench and filling said trench with a material that comprises at least one layer of insulating material, wherein said recess and said trench are formed in a common etch process.

6. The method of claim 1, further comprising forming a second portion of said insulating layer prior to forming said recess, wherein said first and second portions define said gate dielectric layer.

7. The method of claim 1, wherein forming said recess comprises etching through said semiconductor layer and a buried insulation layer that separates said semiconductor layer from a substrate.

8. The method of claim 1, wherein said conductive material comprises doped polysilicon.

9. The method of claim 1, wherein said decoupling capacitor includes a plurality of capacitor elements defined in a plurality of recesses defined in the semiconductor layer, each having electrode portions extending above a surface of said semiconductor layer, and the method further comprises patterning the conductive material to interconnect said electrode portions of said capacitor elements.

* * * * *